United States Patent
Gupta et al.

(10) Patent No.: US 7,353,492 B2
(45) Date of Patent: Apr. 1, 2008

(54) METHOD OF IC FABRICATION, IC MASK FABRICATION AND PROGRAM PRODUCT THEREFOR

(75) Inventors: Puneet Gupta, Sunnyvale, CA (US); Fook-Luen Heng, Yorktown Heights, NY (US); Mark A. Lavin, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 458 days.

(21) Appl. No.: 11/043,482

(22) Filed: Jan. 26, 2005

(65) Prior Publication Data

US 2005/0193363 A1  Sep. 1, 2005

Related U.S. Application Data

(60) Provisional application No. 60/547,921, filed on Feb. 26, 2004.

(51) Int. Cl.
*G06F 17/50* (2006.01)
(52) U.S. Cl. ............... 716/19; 716/2; 716/4; 716/21
(58) Field of Classification Search ............... None
See application file for complete search history.

(56) References Cited

U.S. PATENT DOCUMENTS

| | | | |
|---|---|---|---|
| 5,182,718 A * | 1/1993 | Harafuji et al. | 430/30 |
| 5,682,323 A * | 10/1997 | Pasch et al. | 716/19 |
| 5,847,421 A * | 12/1998 | Yamaguchi | 257/207 |
| 6,194,252 B1 * | 2/2001 | Yamaguchi | 438/129 |
| 6,223,139 B1 | 4/2001 | Wong | |
| 6,425,117 B1 * | 7/2002 | Pasch et al. | 716/21 |
| 6,523,162 B1 * | 2/2003 | Agrawal et al. | 716/19 |
| 6,792,593 B2 * | 9/2004 | Takashima et al. | 716/21 |

OTHER PUBLICATIONS

Robert Ellis et al., Technical Report: JBIG Compression Algorithms for Dummy Fill Layout Data, Mar. 13, 2002.

* cited by examiner

*Primary Examiner*—Leigh M. Garbowski
(74) *Attorney, Agent, or Firm*—Law Office of Charles W. Peterson, Jr.; Louis J. Percello, Esq.; Brian P. Verminski, Esq.

(57) ABSTRACT

A method of forming integrated circuit (IC) chip shapes and a method and computer program product for converting an IC design to a mask, e.g., for standard cell design. Individual book/macro physical designs (layouts) are proximity corrected before unnesting and an outer proximity range is determined for each proximity corrected physical design. Shapes with a unique design (e.g., in boundary cells and unique instances of books) are tagged and the design is unnested. Only the unique shapes are proximity corrected in the unnested design, which may be used to make a mask for fabricating IC chips/wafers.

27 Claims, 4 Drawing Sheets

METHOD OF IC FABRICATION, IC MASK FABRICATION AND PROGRAM PRODUCT THEREFOR

CROSS REFERENCE TO RELATED APPLICATION

The present invention is a continuation of U.S. Provisional Patent Application Ser. No. 60/574,921, entitled "Method to Reduce Runtime For VLSI Dataprep Operation" to Puneet Gupta et al., filed Feb. 26, 2004, assigned to the assignee of the present invention and incorporated herein by reference.

FIELD OF THE INVENTION

The present invention generally relates to integrated circuit manufacturing and more particularly to producing high quality masks for patterning semiconductor layers that define circuit design shapes forming integrated circuits.

BACKGROUND DESCRIPTION

A typical integrated circuit (IC) chip is a stack of several levels or sequentially formed layers of shapes. Each layer is stacked or overlaid on a prior layer and patterned (e.g., photolithographically) to define the shapes that combine to form devices (e.g., field effect transistors (FETs)) and connect the devices into circuits. In a typical state of the art complementary insulated gate FET process, such as what is normally referred to as CMOS, layers are formed on a wafer to form the devices on a surface of the wafer. Further, the surface may be the surface of a silicon layer on a silicon on insulator (SOI) wafer. A simple FET is formed by the intersection of two shapes, a gate layer rectangle on a silicon island formed from the silicon surface layer.

Typically, an electrical design for a circuit (e.g., a logic gate (a book or a block), a latch or a higher level function (a macro)) is converted into a digital-graphical representation or layout of the equivalent physical circuit with shapes on design levels corresponding to desired IC shapes. A typical IC design is formed from a number of such basic elements or books that are placed on a representation of the chip (floorplan) and connected together (wired) for the desired final function. After placing and wiring, the layers of the corresponding chip layout are converted to a series of masks, each holding the intended pattern for one of the chip layers. Each mask is used to pattern one of the layers onto the chip. Ideally, each formed shape exactly matches its corresponding design shape. In reality, printing the mask, printing the mask pattern in photo-resist and forming the photo-resist shape pattern in a semiconductor layer (also known as patterning the layer), produces a somewhat altered the final product, e.g., with rounded corners, notches may close, lines or spaces may narrow and etc. Thus typically, the physical design shapes (layout) are biased to anticipate compensate, somewhat, for these changes.

One such source of such changes from design to final product arises from printing shapes in close proximity to one another. Proximity effects occur on a mask, for example, because light printing one shape in photo-sensitive material (i.e., when the material is exposed in the form of the printed shape) also diffuses to neighboring material. So, as each shape is printed, light diffuses to previously printed neighboring shapes, e.g., onto the entire printed shape or onto an edge, overexposing the shape and/or causing it to print slightly out of focus, i.e., causing what is known as proximity effects. Since it is impossible to determine what shapes will be effected by what other shapes (i.e., what shapes are in close proximity of each other) until after place and wire, design shapes have not been biased for proximity effects until after place and wire, when the distance between neighboring shapes is certain. So, after physical design, the design data is prepared (also known as dataprep) for the mask making tool. During dataprep biases are computed for each chip shape and added to physical design shapes to compensate for proximity effects and improve the match between design and mask/wafer shapes.

Unfortunately, a typical state of the art IC design may have thousands, millions and perhaps billions of shapes on each layer. Consequently, proximity correcting all of the shapes on each of the layers can be a daunting task, consuming a tremendous amount of computing resources for each layer, e.g., it may take 440 CPU hours (more than 18 days of dedicated computer time) in a state of the art high performance server. So, the turnaround time for dataprep of a single such mask layer on a typical state of the art high performance server may be months. Prior solutions to mitigate this turn around time include parallel computing and resorting to more efficient correction algorithms. However, using even the most advanced algorithms and the most powerful servers, it may still take more than a CPU week to complete proximity correction for a single chip. Thus, dataprep on a single design can clog a foundry that is meant to process several chip designs in that week.

Thus, there is a need for improved dataprep techniques for complex IC designs and more particularly, for more efficient methods of proximity correcting design data.

SUMMARY OF THE INVENTION

It is a purpose of the invention to reduce IC design to product turn around time;

It is another purpose of the invention to reduce the resources consumed in converting an IC physical design into masks;

It is another purpose of the invention to reduce IC mask dataprep time;

It is yet another purpose of the invention to reduce the volume of data handled in making IC masks, while reducing dataprep time.

The present invention relates to a method of forming integrated circuit (IC) chip shapes and a method and computer program product for converting an IC design to a mask, e.g., for standard cell design. Individual book/macro physical designs (layouts) are proximity corrected before unnesting and an outer proximity range is determined for each proximity corrected physical design. Shapes with a unique design (e.g., in boundary cells and unique instances of books) are tagged and the design is unnested. Only the unique shapes are proximity corrected in the unnested design, which may be used to make a mask for fabricating IC chips/wafers.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
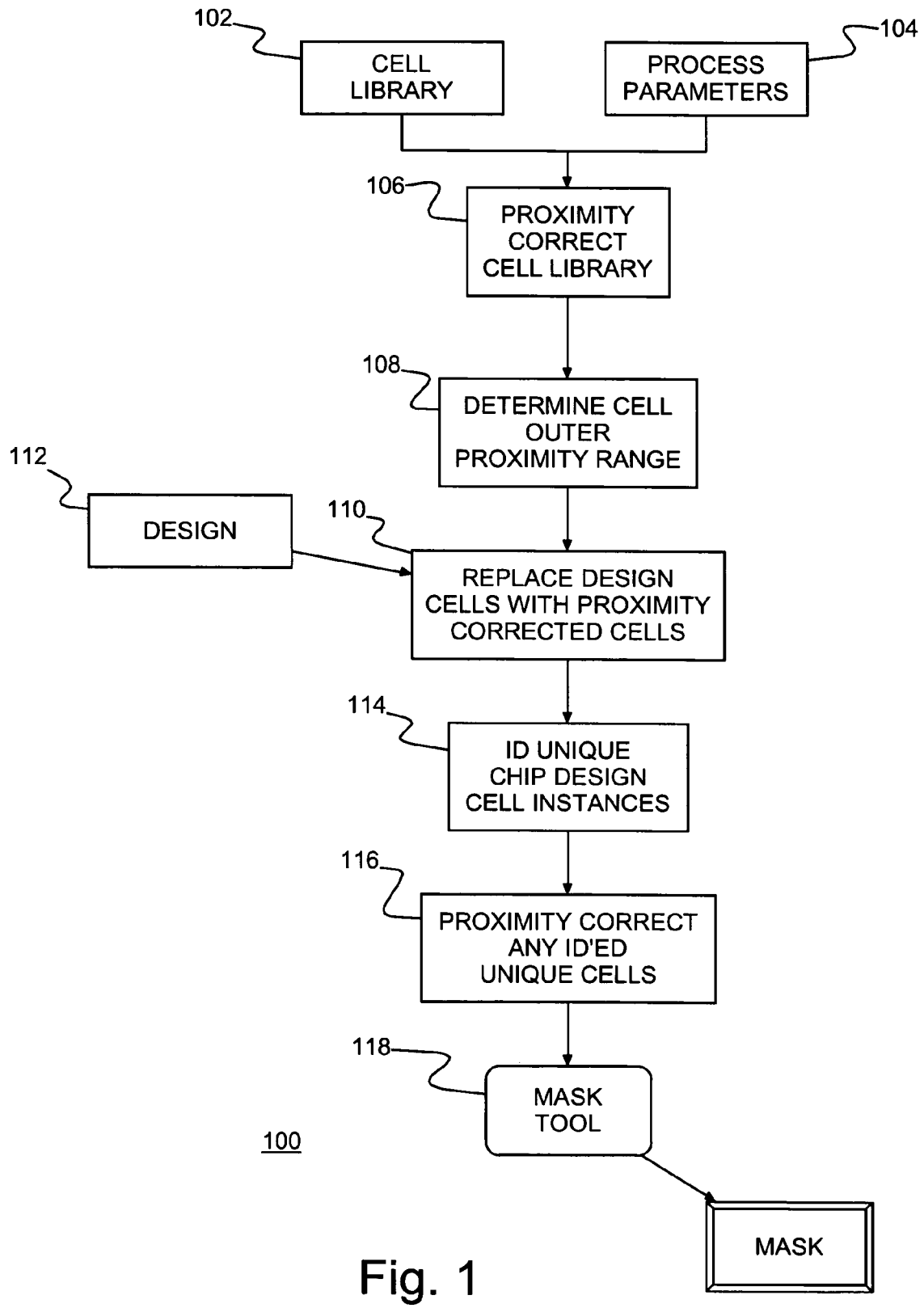
FIG. 1 shows a flow diagram example for fabricating integrated circuits and, in particular, in converting design data to mask shapes according to a preferred embodiment of the present invention.

Turning now to the drawings and, more particularly, FIG. 1 shows a flow diagram example 100 for fabricating integrated circuits (ICs) and, in particular, converting design data for use in a mask making tool (e.g., dataprep) to form mask shapes according to a preferred embodiment of the present invention. The present invention has application to any hierarchical circuit design, whether a fully custom design, a nested design or a design based in standard cell logic. Thus, the design is based on a cell library 102 that, typically, contains physical designs (design layouts) for basic design blocks or books used by a designer in designing an IC chip. For example, the cell library 102 may be a standard cell logic library for standard cell design and, optionally, may also include specially designed blocks/ books, macros and etc., e.g., simple and complex logic designed for a particular project or chip design. A process parameter database 104 contains process specific information (e.g., line width and space biases for a particular mask making tool) that may be updated and/or revised as needed. It should be noted that cell, book and block are used interchangeably herein as referring to the physical design for the particular library function, unless specifically set forth differently hereinbelow. Further, although described herein as applying each step to physical designs for all books in the cell library; it is understood, however, that this is for example only and, each step may be applied to groups of physical designs or, each physical book designs individually and one at a time.

So, beginning in step 106, process parameters 104 are applied to physical designs for books or cells from the cell library 102, e.g., applying biases to design shapes and proximity correcting biased shapes for neighboring shapes or the lack thereof. Then, in step 108, an outer proximity range is determined for the proximity corrected design(s). Next in step 110, books in a design 112 are replaced with the corresponding proximity corrected physical designs. Then, in step 114 physical designs or layouts for any unique shapes or circuits (e.g., global wiring) that have not previously been biased are identified and, in step 116, proximity corrected. The resulting proximity corrected layout may be further checked, if desired, and forwarded to mask making tool 118, where the proximity corrected shapes on each layer are printed onto masks for use in integrated circuit chip fabrication.

Figure 2:
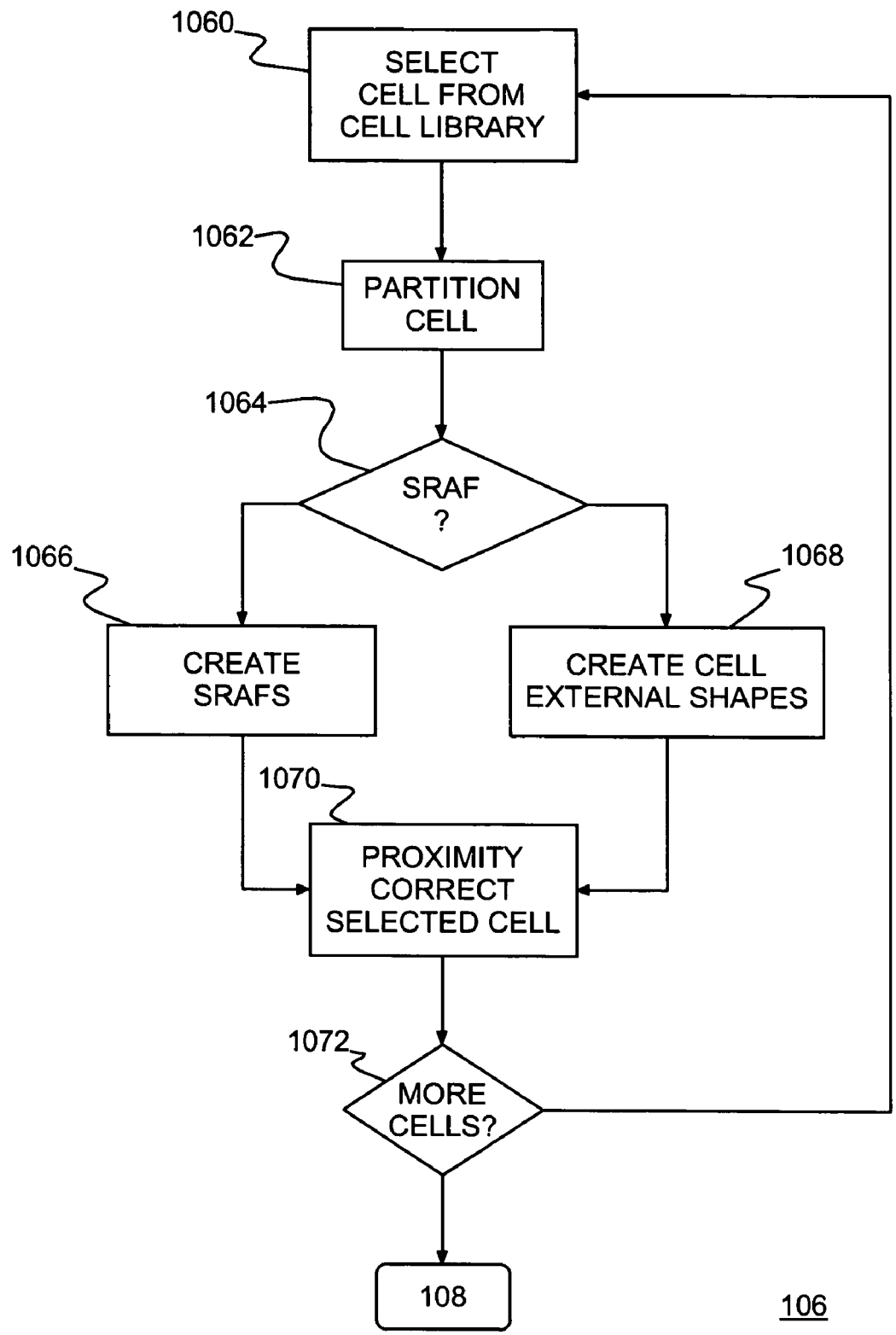
FIG. 2 shows an example of the step of proximity correcting physical designs for cell/books in the cell library in more detail.

FIG. 2 shows an example of the step 106 of proximity correcting physical designs for books in the cell library 102 in more detail. First in step 1060, a layout is selected from the cell library. Then, in step 1062, the layout is partitioned into periphery/perimeter shapes and internal shapes. So, shapes that may be subject to proximity effects from exterior (non-cell) shapes are identified and designated as periphery/ perimeter shapes. Any remaining shapes are identified as internal shape. For internal partition shapes proximity effects can be determined to a very high degree of certainty, i.e., because a given maximum proximity range of the internal shape(s) does not exceed the book boundary and so, all relevant shapes are known and included in the particular cell. Preferably, the periphery/perimeter shapes are further sub-partitioned, e.g., corners regions and perimeter regions. If in step 1064, the selected dataprep tool includes a Sub-Resolution Assist Feature (SRAF); then in step 1066, external SRAF structures are created at a minimum possible distance from the boundary shapes. SRAF structures are modified aerial images of the primary features and allow for reducing dense-iso biases across pitch leading to a larger overlapping depth of field across multiple pitches. If the tool does not include a SRAF capability, then in step 1068, external minimum width shapes (dummy shapes) are created at a minimum possible distance from the boundary shapes. These SRAF structures or the external dummy shapes define a first order proximity environment for the layout. Next, in step 1070 the layout is proximity corrected, i.e., proximity correction biases are applied to all the shapes in the layout within the first order proximity environment. In step 1072 if more cells remain for proximity correction, another is selected in step 1060 and proximity corrected. Once in step 1072 all physical designs have been proximity corrected, an outer proximity range may be determined for each cell in step 108.

Figure 3A:
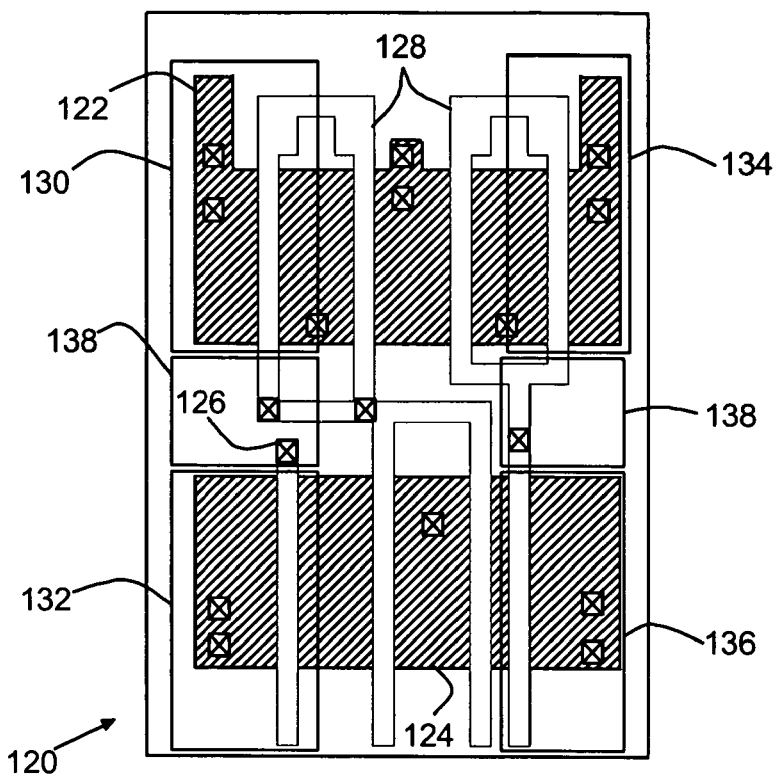
FIGS. 3A-B show an example of partitioning the physical design of a typical standard cell and of defining the proximity environment for the physical design.
Figure 3B:
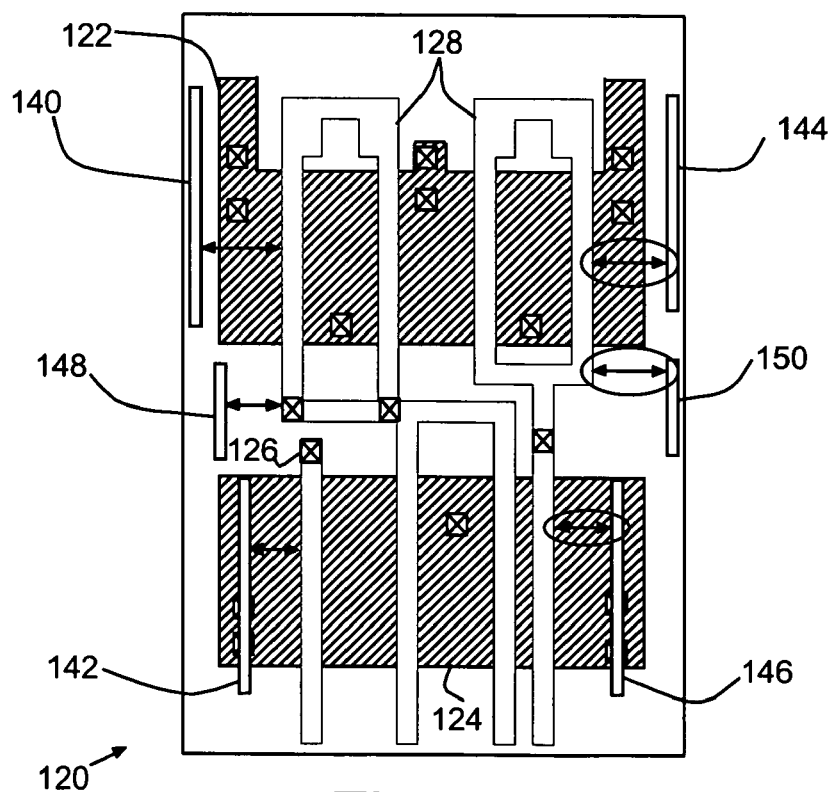

FIGS. 3A-B show an example of partitioning a typical standard cell physical design or layout 120 in step 1062 and of defining the proximity environment in step 1068. The standard cell 120 of this example includes a top P-type Field Effect Transistor (PFET) row at p-type diffusion shape 122 and a bottom N-type Field Effect Transistors (NFETs) row at n-type diffusion shape 124. Space between the device rows 122, 124 is available for wiring channels with contacts (e.g., 126) strategically located for local wiring, power and ground. Devices are formed at intersections of poly (e.g., 128) with diffusions 122, 124. In this example the cell 120 is partitioned into 6 boundary regions including the leftmost PFET corner 130, leftmost NFET corner 132, the rightmost PFET corner 134, the rightmost NFET corner 136, contact perimeter regions 138 and internal shapes (everything else). Since the internal shapes are surrounded only by cell shapes, internal shapes only need to be proximity corrected once and those proximity corrected shapes are valid regardless of other shapes that may subsequently be placed at the cell perimeter. The proximity correction biases applied to each boundary region 130, 132, 134, 136, 138 may vary depending upon whether external shapes are placed in the final chip at the cell perimeter and where they may be placed.

In a typical standard cell placement, a cell instance will have two immediate neighbors. Both neighboring cells can include actual poly gates or simple filler cells to cover white (open) space. The gate poly shapes can encounter a variety of neighboring spaces that depend upon the space between the gate poly shapes and the cell outline, as well as poly in neighboring cells. Dummy shapes 140, 142, 144, 146, 148, 150 (e.g., dummy poly) are inserted in step 1068 that emulate a typical adjacent layout and are judiciously located at a predetermined spacing from the cell outline before proximity correcting the cell. So, dummy shapes 140, 142, 144, 146, 148, 150, are created located at a minimum possible distance from cell boundary shapes. It should be noted that too close of a spacing may cause correcting actual gate poly shapes as "dense" lines and so, may print the lines smaller than intended. After creating the dummy shapes 140, 142, 144, 146, 148, 150, the cell boundary shapes may be proximity corrected both with and without the dummy shapes 140, 142, 144, 146, 148, 150. Dummy shapes 140, 142, 144, 146 at top and bottom of the layout prevent biasing that results in shorts to poly in neighboring cell rows and avoids mask rule violations. Although typically the top and bottom dummy shapes 140, 142, 144, 146 do not affect cell critical dimensions, they can impact contact coverage, e.g., if there are contacts located near the top or bottom boundary of the cell. Dummy shapes 148, 150 are inserted near the contacts. These dummy shapes 148, 150 also prevent shorts or mask violations from proximity corrected poly shapes but, if not placed properly, they can significantly reduce contact coverage. Several versions of proximity corrected shapes may be produced based on some predetermined/ expected proximity environments of the particular region 130, 132, 134, 136, 138. Preferably, each proximity corrected version is associated with some proximity environment range and all versions may be stored with the cell library 102.

Figure 4:
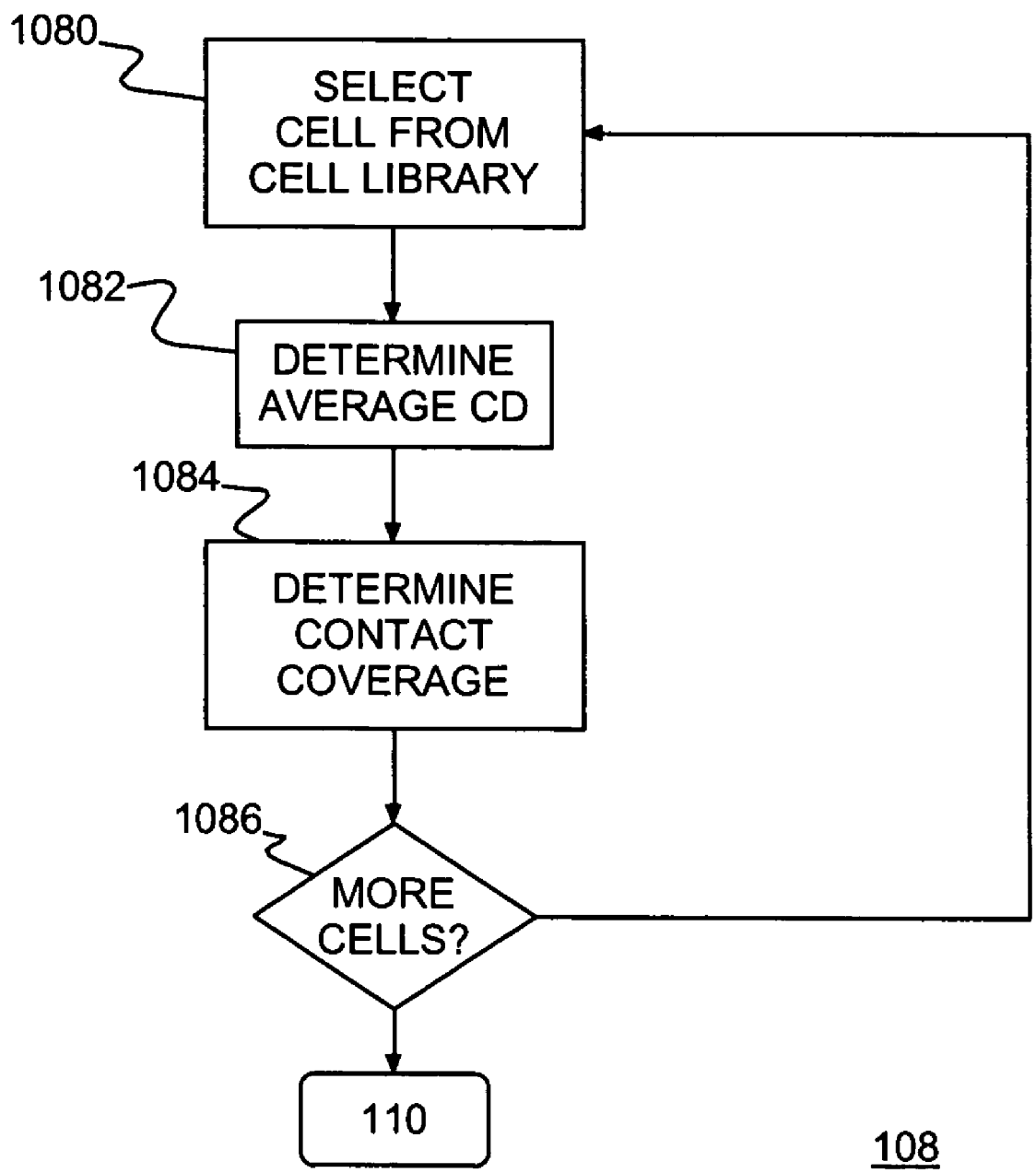
FIG. 4 shows an example in more detail of the step of determining cell outer proximity correction range.

FIG. 4 shows an example in more detail of the step 108 of determining the cell outer proximity correction range, i.e., the range of the proximity environment where shapes manufactured from the corrected shapes still meet electrical requirements. This range is determined in two measurements and is the distance between the external shapes in the proximity environment and boundary shapes. So first, a cell is selected in step 1080 and in step 1082 the average critical dimension (CD) is measured for cell transistors, e.g., modeling transistors from the wafer image of the corrected shapes. Typically, the simulated gate/transistor area is computed and the average CD is that area divided by the transistor width, i.e., the shape's length. The corrected shape is within required electrical tolerance whenever the difference falls between the average simulated CD and the target CD to within a specified tolerance. Next, in step 1084 contact coverage area is measured. Contact coverage area is the intersection of a contact with its simulated interconnect and device layer shapes. In step 1086, the cell library 102 is checked for additional proximity corrected cells until an outer proximity correction range has been found for all proximity corrected cells and the cells may be placed in the design in step 110.

So in a standard cell design 112, placed predefined rows of cell instances are replaced in step 110 by the proximity corrected internal shapes and corresponding corrected boundary shapes. Since the left and right neighbors of each cell define its environment, the distance between the boundary shapes of a particular cell and the boundary shapes of neighboring cells define the cell's proximity environment. So for an internal (internal to one of the rows) cell, the corresponding proximity corrected shapes are used for each of the boundary regions (e.g., 130, 132, 134, 136, 138 of the example of FIG. 3A). Otherwise in step 114, boundary cells and other unique cells are identified and shapes tagged as having a proximity environment where corresponding proximity corrected shapes do not exist. The chip design is unnested and, in step 116 only tagged shapes are proximity corrected. Also, after the shapes are tagged, the dummy shapes 140, 142, 144, 146, 148, 150 may be removed as desired. Once the tagged shapes are proximity corrected, chip proximity correction is complete. Thus, the proximity corrected design may be passed to mask making 118. The final mask used to print a particular IC chip layer with quality equivalent that from masks made using slower, more data intensive full chip design proximity correction techniques.

Advantageously, since physical designs for nested cells are proximity corrected prior to unnesting and unique shapes identified for proximity correction later, e.g., when the chip design is unnested, chip level proximity correction runtime and output data size is dramatically reduced. Typically, such reduction is orders of magnitude smaller and faster. For a typical Application Specific IC (ASIC) design, the reduction is a factor of the ratio of the number of placed cells to the number of cell definitions. For example, an ASIC chip with 50,000 placed cells from a 1000 unique cell library, may realize a 50× reduction. Moreover, this turn around time improvement and also data reduction are achieved with little if any meaningful loss of accuracy or mask quality.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:

1. A method of fabricating integrated circuits (ICs), said ICs including one or more photolithographically formed layers, at least one of said photolithographically formed layers being patterned from a mask, said mask being printed from a design pattern comprising the steps of:
   a) proximity correcting circuit design books in a circuit library;
   b) determining an outer proximity range for each proximity corrected book;
   c) replacing corresponding books in a circuit design with said proximity corrected design books; and
   d) proximity correcting unique shapes in said circuit design.

2. A method of fabricating ICs as in claim 1, wherein the step (a) of proximity correcting books comprises the steps of:
   i) partitioning a physical design for a book being proximity corrected;
   ii) creating external features for said book; and
   iii) proximity correcting shapes in said physical design.

3. A method of fabricating ICs as in claim 2, wherein said partitioning step (i) partitions said physical design into boundary partitions and an internal partition.

4. A method of fabricating ICs as in claim 3, wherein said boundary partitions include right and left partitions.

5. A method of fabricating ICs as in claim 4, wherein said right and left partitions include corner partitions and contact perimeter partitions.

6. A method of fabricating ICs as in claim 2, wherein creating external features in step (ii) comprises creating Sub-Resolution Assist Feature (SRAF) structures at a minimum possible distance from boundary shapes.

7. A method of fabricating ICs as in claim 2, wherein creating external features in step (ii) comprises creating dummy shapes at a minimum possible distance from boundary shapes.

8. A method of fabricating ICs as in claim 2, wherein said book is selected from a library of said books, and the step (a) of proximity correcting books further comprises the steps of:
   iv) checking said library of books to determine whether books remain for proximity correction; and until all books have been proximity corrected,
   v) selecting a remaining one of said books and returning to step (i).

9. A method of fabricating ICs as in claim 8, before the step (d) of proximity correcting unique design shapes, said method further comprising removing external features created in step (ii).

10. A method of fabricating ICs as in claim 1, wherein the step (b) of determining an outer proximity range comprises the steps of:
    i) determining an average critical dimension for said each proximity corrected book; and
    ii) determining a contact coverage for said each proximity corrected book.

11. A method of fabricating ICs as in claim 1, wherein the step (d) of proximity correcting said unique shapes comprises identifying boundary cells and unique instances of books in said circuit design, perimeter shapes in said identified boundary cells and unique book instances being tagged as unique.

12. A method of fabricating integrated circuit (IC) chip masks from a circuit design, said method comprising the steps of:
    a) providing a cell library of physical designs for a plurality of circuit books;
    b) providing a process definition including process and mask making parameters for a selected integrated circuit fabrication process;
    c) selectively proximity correcting ones of said physical designs;
    d) determining an outer proximity range for each proximity corrected physical design;
    e) providing a chip design for an integrated circuit, said chip design including a plurality of placed and wired said circuit books selected from said cell library;
    f) replacing corresponding placed and said wired circuit books in said chip design with said proximity corrected physical designs;
    g) identifying unique design shapes in said chip design; and
    h) proximity correcting said identified unique shapes in said chip design.

13. A method as in claim 12, wherein the step (c) of selectively proximity correcting physical designs comprises the steps of:
    i) selecting a physical design from said library;
    ii) partitioning the selected physical design;
    iii) creating external features for said selected physical design;
    iv) proximity correcting shapes in at least one partition in said selected physical design; and
    v) returning to step (i).

14. A method as in claim 13, wherein said partitioning step (ii) partitions said physical design into boundary partitions and an internal partition.

15. A method as in claim 14, wherein said boundary partitions include right and left corner partitions and contact perimeter partitions.

16. A method as in claim 15, wherein creating external features in step (iii) comprises creating Sub-Resolution Assist Feature (SRAF) structures at a minimum possible distance from shapes in said boundary partitions.

17. A method as in claim 15, wherein creating external features in step (iii) comprises creating dummy shapes at a minimum possible distance from shapes in said boundary partitions.

18. A method as in claim 5, before the step (h) of proximity correcting unique design shapes, said method further comprising removing external features created in step (iii).

19. A method as in claim 18, wherein the step (d) of determining an outer proximity range comprises the steps of:
    i) determining an average critical dimension for said each proximity corrected physical design; and
    ii) determining a contact coverage for said each proximity corrected physical design.

20. A method as in claim 19, wherein the step (g) of proximity correcting said unique shapes completes proximity correction of an IC chip design and said step (h) comprises identifying boundary cells and unique instances of books in said circuit design, perimeter shapes in identified said boundary cells and unique book instances being tagged as unique.

21. A method as in claim 20, further comprising printing a mask from said proximity corrected said IC chip design.

22. A computer program product for printing masks for an integrated circuit (IC) design, said computer program product comprising a computer usable medium having computer readable program code thereon, said computer readable program code comprising:
    computer readable program code means for identifying circuit books from a circuit library as being included in a chip design;
    computer readable program code means for proximity correcting physical designs for said identified circuit books;
    computer readable program code means for determining an outer proximity range for each of said circuit books;
    computer readable program code means for replacing corresponding books in a circuit design with said proximity corrected physical designs; and
    computer readable program code means for identifying boundary cells and unique instances of books in said circuit design, perimeter shapes in identified said boundary cells and unique book instances being said tagged as unique, tagged shapes being proximity corrected unique shapes in said circuit design, whereby an IC mask may be made from said circuit design with said proximity corrected physical designs and said proximity corrected unique shapes.

23. A computer program product for printing masks for an IC design as in claim 22, wherein the computer readable program code means for proximity correcting comprises:
    computer readable program code means for partitioning a physical design;
    computer readable program code means for creating external features for said partitioned physical design; and
    computer readable program code means for proximity correcting physical design shapes in said partitioned physical design.

24. A computer program product for printing masks for an IC design as in claim 23, wherein said computer readable program code means for partitioning comprises computer readable program code means for identifying right and left corner partitions and contact perimeter partitions.

25. A computer program product for printing masks for an IC design as in claim 24, wherein said computer readable program code means for determining an outer proximity range comprises computer readable program code means for creating Sub-Resolution Assist Features at a maximum proximity distance from boundary shapes.

26. A computer program product for printing masks for an IC design as in claim 24, wherein said computer readable program code means for determining an outer proximity range comprises computer readable program code means for creating dummy shapes at a maximum proximity distance from boundary shapes.

27. A computer program product for printing masks for an IC design as in claim 24, wherein said computer readable program code means for determining an outer proximity range comprises computer readable program code means for removing external features from said physical designs.

* * * * *